(12) United States Patent
Jiao et al.

(10) Patent No.: US 12,164,883 B2
(45) Date of Patent: Dec. 10, 2024

(54) METHOD OF DATA PROCESSING, CORRESPONDING MAC CIRCUIT, DSP SYSTEM AND COMPUTER PROGRAM PRODUCT

(71) Applicant: STMICROELECTRONICS S.r.l., Agrate Brianza (IT)

(72) Inventors: Xiao Kang Jiao, Monza (IT); Fabio Giuseppe De Ambroggi, Biassono (IT); Loris Luise, Ornago (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 853 days.

(21) Appl. No.: 17/203,591

(22) Filed: Mar. 16, 2021

(65) Prior Publication Data
US 2021/0303267 A1     Sep. 30, 2021

(30) Foreign Application Priority Data
Mar. 25, 2020   (IT) .................. 102020000006298

(51) Int. Cl.
*G06F 7/544*    (2006.01)
*G06F 3/06*    (2006.01)
(Continued)

(52) U.S. Cl.
CPC .......... *G06F 7/5443* (2013.01); *G06F 3/0604* (2013.01); *G06F 3/065* (2013.01);
(Continued)

(58) Field of Classification Search
CPC ........ G06F 7/5443; G06F 3/0604; G06F 3/65; G06F 3/0659; H03H 17/16; H03M 1/12
(Continued)

(56) References Cited

U.S. PATENT DOCUMENTS 6,122,653 A     9/2000  Kuroda
7,107,302 B1 *  9/2006  Fridman ................. G06F 17/10
                                          708/319

(Continued)

FOREIGN PATENT DOCUMENTS

CN     110458279 A   11/2019
CN     110780923 A    2/2020
DE     197 18 224 A1 11/1997

OTHER PUBLICATIONS

Hu et al., "BitFlow: Exploiting Vector Parallelism for Binary Neural Networks on CPU," 2018 IEEE International Parallel and Distributed Processing Symposium, May 21-25, 2018, Vancouver, BC, Canada, 10 pages.

(Continued)

*Primary Examiner* — Tan V Mai
(74) *Attorney, Agent, or Firm* — Seed IP Law Group LLP

(57) ABSTRACT

A method includes retrieving a plurality of datasets from respective memory registers of a memory and storing the retrieved plurality of datasets in respective register portions of a first register. A dataset of data-processing coefficients are stored in a second register. First processing is applied using, as the first operand, a first sub-set of dataset elements stored in the first register, and using, as the second operand, the data-processing coefficients, obtaining a first result. Second processing is applied using, as the first operand, a second sub-set of dataset elements stored in the first register comprised in a second window having a size equal to the dataset size, and using, as the second operand, the replica of the dataset of data-processing coefficients, obtaining a second result. An output is generated based on the first and second results. The first and second processing may perform multiply accumulate (MAC) operations.

27 Claims, 2 Drawing Sheets

(51) Int. Cl.
    *H03H 17/06*     (2006.01)
    *H03M 1/12*     (2006.01)

(52) U.S. Cl.
    CPC ........... *G06F 3/0659* (2013.01); *H03H 17/06* (2013.01); *H03M 1/12* (2013.01)

(58) Field of Classification Search
    USPC .......................................... 708/603, 300–323
    See application file for complete search history.

(56) References Cited

U.S. PATENT DOCUMENTS

| | | | |
|---|---|---|---|
| 7,353,244 B2 * | 4/2008 | Aldrich | G06F 7/5443 708/319 |
| 8,880,850 B2 | 11/2014 | Ramchandran et al. | |
| 10,366,050 B2 | 7/2019 | Henry et al. | |
| 2003/0145030 A1 | 7/2003 | Sheaffer | |
| 2014/0074901 A1 | 3/2014 | Olofsson et al. | |
| 2018/0144240 A1 | 5/2018 | Garbin et al. | |
| 2022/0414420 A1 | 12/2022 | Luise et al. | |

OTHER PUBLICATIONS

Zhang et al., "daBNN: A Super Fast Inference Framework for Binary Neural Networks on ARM devices," The 27th ACM International Conference on Multimedia, Oct. 21-25, 2019, Nice, France, 4 pages.

Hu et al. "BitFlow: Exploiting Vector Parallelism for Binary Neural Networks on CPU" 2018 IEEE International Parallel and Distributed Processing Symposium 2018. 10 pages.

Zhang et al. "daBNN: A Super Fast Inference Framework for Binary Neural Networks on ARM devices" JD AI Research, Beijing, China, Aug. 16, 2019. 4 pages.

* cited by examiner

METHOD OF DATA PROCESSING, CORRESPONDING MAC CIRCUIT, DSP SYSTEM AND COMPUTER PROGRAM PRODUCT

BACKGROUND

Technical Field

The description relates to methods of computing operations of multiplication and accumulation, briefly MAC, of (digital) data.

One or more embodiments may be applied to Digital signal processors (briefly, DSPs).

Description of the Related Art

Digital data processing may use operations of multiplication and accumulation of digital data a, b. For instance, such operation may be expressed as:

$$z=x*y+z.$$

Digital signal processors (DSPs) may include a multiply or a multiply and accumulate (MAC) computational circuit, which may be adapted to multiply and accumulate digital operands for controlling and data processing tasks.

As multiplication and accumulation of digital numbers are building blocks of data processing in various applications, there is an activity towards improving multiply and accumulate circuit units.

For instance, MAC operations may be expressed as:

$$c=a*b+c.$$

Existing solutions to perform multiply-accumulate operations, may have one or more of the following drawbacks:
 high power consumption;
 misaligned memory accessing; and
 complex structure and logic.

BRIEF SUMMARY

In an embodiment, a method comprises: retrieving a plurality of datasets from respective memory registers of a plurality of memory registers of a memory, wherein the datasets have a dataset size and comprise sets of ordered indexed elements having respective indices; storing the retrieved plurality of datasets in respective register portions of a first register; storing a dataset of coefficients having the dataset size in a second register; setting a shift-setting parameter as a function of the dataset size; generating a replica of the dataset of coefficients; applying a first operation using, as a first operand, a first sub-set of dataset elements stored in a first window of the first register, the first window having a size equal to the dataset size, and using, as a second operand, the dataset of coefficients stored in the second register, generating a first interim result; applying a second operation using, as a first operand, a second sub-set of dataset elements stored in a second window of the first register, the second window having a size equal to the dataset size, and using, as a second operand, the replica of the dataset of coefficients, generating a second interim result; and generating an output based on the first and the second interim results, wherein: the second sub-set of dataset elements has at least one dataset element having an index different from indices of elements of the first sub-set of dataset elements; the first sub-set of dataset elements has a first element selected as a function of the shift-setting parameter; and the second sub-set of dataset elements has a first element selected as a function of the shift-setting parameter. In an embodiment, the plurality of datasets comprises two datasets. In an embodiment, setting the shift-setting parameter as a function of the dataset size comprises computing a shift-setting parameter value as an even multiple of a value of half the size of the second register decreased by one. In an embodiment, the second sub-set of dataset elements has at least one dataset element having an index greater than indices of elements of the first sub-set of dataset elements. In an embodiment, the second window is shifted by one element with respect to the first window. In an embodiment, the dataset of coefficients comprises multiply and accumulate (MAC) processing coefficients; and the first and second operations implement MAC operations. In an embodiment, the first and second operations implement finite impulse response (FIR) filtering and the dataset of coefficients comprises FIR coefficients. In an embodiment, the first and second operations are iterative, and the shift-setting parameter is incremented in each iteration. In an embodiment, the method comprises generating the replica of the dataset of coefficients by shifting the coefficients of the set of coefficients based on the shift-setting parameter.

In an embodiment, a device comprises: a memory having a plurality of memory registers; a first register; a second register; and data processing circuitry coupled to the memory, the first register and the second register, wherein the data processing circuitry, in operation: retrieves a plurality of datasets from a respective memory registers of the memory, wherein the datasets have a dataset size and comprise sets of ordered indexed elements having respective indices; stores the retrieved plurality of datasets in respective portions of the first register; stores a dataset of coefficients, the dataset of coefficients having the dataset size; sets a shift-setting parameter as a function of the dataset size; generates a replica of the dataset of coefficients based on the dataset of coefficients and the shift-setting parameter; applies a first operation using a first sub-set of dataset elements stored in a first window of the first register as a first operand and the dataset of coefficients as a second operand, generating a first interim result, the first window having a size equal to the dataset size; applies a second operation using a second sub-set of dataset elements stored in a second window of the first register as a first operand and the replica of the dataset of coefficients as a second operand, generating a second interim result, the second window having a size equal to the dataset size; and generates an output based on the first and second interim results, wherein, the second sub-set of dataset elements comprises at least one dataset element having an index different from indices of elements of the first sub-set of dataset elements; the first sub-set of dataset elements has a first element selected as a function of the shift-setting parameter; and the second sub-set of dataset elements has a first element selected as a function of the shift-setting parameter. In an embodiment, the plurality of datasets comprises two datasets. In an embodiment, the data processing circuitry, in operation, computes a shift-setting parameter value as an even multiple of a value of half the size of the second register decreased by one. In an embodiment, the second sub-set of dataset elements has at least one dataset element having an index greater than indices of elements of the first sub-set of dataset elements. In an embodiment, the second window is shifted by one element with respect to the first window. In an embodiment, the dataset of coefficients comprises multiply and accumulate (MAC) processing coefficients; the data processing circuitry comprises: a first MAC circuit, which, in operation, implements the first operation; and a second MAC circuit, which, in operation, implements the second operation. In an embodiment, the data processing circuitry, in operation, implements finite impulse response (FIR) filtering, and the MAC processing coefficients are FIR coefficients. In an embodiment, the data processing circuitry, in operation, iteratively performs the first and second operations, and increments the shift-setting parameter in each iteration.

In an embodiment, a system comprises: an analog-to-digital converter, which, in operation, time samples analog signals; and digital signal processing circuitry coupled to the analog-to-digital converter and including a memory, a first register and a second register, wherein the digital signal processing circuitry, in operation: stores datasets of time samples generated by the analog-to-digital converter in the memory, the datasets having a dataset size and comprising sets of ordered indexed elements having respective indices; retrieves a plurality of datasets from the memory and stores the retrieved datasets in respective portions of the first register; stores a dataset of coefficients in the second register, the dataset of coefficients having the dataset size; sets a shift-setting parameter as a function of the dataset size; generates a replica of the dataset of coefficients; generates a first interim result using a first sub-set of dataset elements stored in a first window of the first register as a first operand and the dataset of coefficients as a second operand of a first processing operation, the first window having a size equal to the dataset size; generates a second interim result using a second sub-set of dataset elements stored in a second window of the first register as a first operand and the replica of the dataset of coefficients as a second operand of a second processing operation, the second window having a size equal to the dataset size; and generates an output based on the first and second interim results, wherein, the second sub-set of dataset elements comprises at least one dataset element having an index different from indices of elements of the first sub-set of dataset elements; the first sub-set of dataset elements has a first element selected as a function of the shift-setting parameter; and the second sub-set of dataset elements has a first element selected as a function of the shift-setting parameter. In an embodiment, the dataset of coefficients comprises multiply and accumulate (MAC) processing coefficients; the digital signal processing circuitry comprises: a first MAC circuit, which, in operation, implements the first operation; and a second MAC circuit, which, in operation, implements the second operation. In an embodiment, the digital signal processing circuitry, in operation, implements finite impulse response (FIR) filtering, and the MAC processing coefficients are FIR coefficients. In an embodiment, the digital signal processing circuitry, in operation, iteratively performs the first and second operations, and increments the shift-setting parameter in each iteration. In an embodiment, the memory comprises a plurality of memory registers each having a size equal to the dataset size.

In an embodiment, a non-transitory computer-readable storage medium's stored contents configure a computing system to perform a method, the method comprising: retrieving a plurality of datasets from respective memory registers of a plurality of memory registers of the computing system, wherein the datasets have a dataset size and comprise sets of ordered indexed elements having respective indices; storing the retrieved plurality of datasets in respective register portions of a first register; storing a dataset of coefficients having the dataset size in a second register; setting a shift-setting parameter as a function of the dataset size; generating a replica of the dataset of coefficients; applying a first operation using, as a first operand, a first sub-set of dataset elements stored in a first window of the first register, the first window having a size equal to the dataset size, and using, as a second operand, the dataset of coefficients stored in the second register, generating a first interim result; applying a second operation using, as a first operand, a second sub-set of dataset elements stored in a second window of the first register, the second window having a size equal to the dataset size, and using, as a second operand, the replica of the dataset of coefficients, generating a second interim result; and generating an output based on the first and the second interim results, wherein: the second sub-set of dataset elements has at least one dataset element having an index different from indices of elements of the first sub-set of dataset elements; the first sub-set of dataset elements has a first element selected as a function of the shift-setting parameter; and the second sub-set of dataset elements has a first element selected as a function of the shift-setting parameter. In an embodiment, setting the shift-setting parameter as a function of the dataset size comprises computing the shift-setting parameter value as an even multiple of a value of half the size of the second register decreased by one. In an embodiment, the first subset comprises an element selected as a function of the shift-setting parameter, and the second sub-set comprises an element selected as a function of the shift-setting parameter; and the second window is shifted by one element with respect to the first window. In an embodiment, the dataset of coefficients comprises multiply and accumulate (MAC) operation coefficients. In an embodiment, the contents comprise instructions, which when executed by the computing system, cause the computing system to perform the method.

One or more embodiments may comprise a computer program product loadable in the memory of at least one processing circuit (e.g., a computer) and comprising software code portions for executing the steps of the method when the product is run on at least one processing circuit. As used herein, reference to such a computer program product is understood as being equivalent to reference to computer-readable medium containing instructions for controlling the processing system in order to co-ordinate implementation of the method according to one or more embodiments. Reference to "at least one computer" is intended to highlight the possibility for one or more embodiments to be implemented in modular and/or distributed form.

One or more embodiments may facilitate providing an ultra-low-power solution to perform multiply-accumulate operations in DSP systems.

One or more embodiments may advantageously facilitate computing multiply-accumulate data processing operations using simpler, higher efficiency and lower power consumption methods.

One or more embodiments may exploit an effective data management method. One or more embodiments may be used not only in multiply-accumulate operation, but also other similar operations.

BRIEF DESCRIPTION OF THE SEVERAL VIEWS OF THE DRAWINGS

One or more embodiments will now be described, by way of non-limiting example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

The drawings are in simplified form and are not to precise scale. For the sake of simplicity, directional (up/down, etc.) or motional (forward/back, etc.) terms may be used with respect to the drawings. The term "couple" and similar terms do not necessarily denote direct and immediate connections, but also include connections through intermediate elements or devices.

For the sake of simplicity, principles underlying embodiments as exemplified herein are discussed mainly with reference to MAC processing as data-processing operation, being otherwise understood that such a data-processing is purely exemplary and in no way limiting.

One or more embodiments as exemplified herein may be applicable to any data-processing operation involving at least two operands, for instance sum, sub, logic operation (OR, AND, NOT, XOR). For example, MAC processing circuit can be implemented using logic-XOR in some cases.

Figure 1:
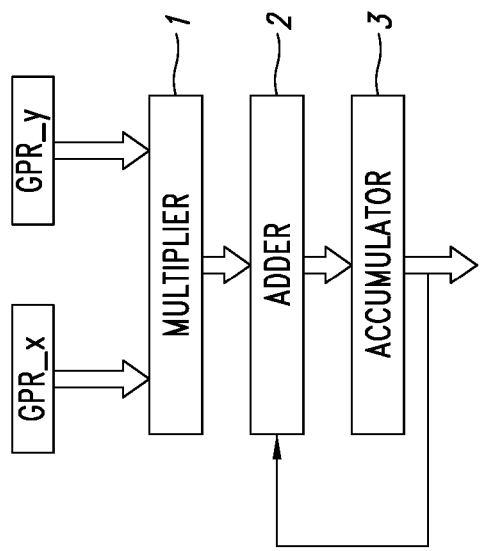
FIG. 1 is an exemplary flowchart of operations to perform a multiply-and-accumulate operation.

As exemplified in FIG. 1, a dedicated MAC circuit may comprise:
- general purpose registers GPR_X, GPR_Y configured to store MAC operands, e.g., a and b;
- a multiplier circuit 1, configured to perform multiplication of the input operands GPR_X, GPR_Y, providing a multiplication product as a result;
- an adder circuit 2 configured to recursively compute summation of the multiplication product with the output of the previous MAC calculation;
- an accumulator circuit 3, for instance a block of memory registers, configured to store the summation result; and
- an output node Z configured to provide the output value Z of the MAC circuit.

Figure 2:
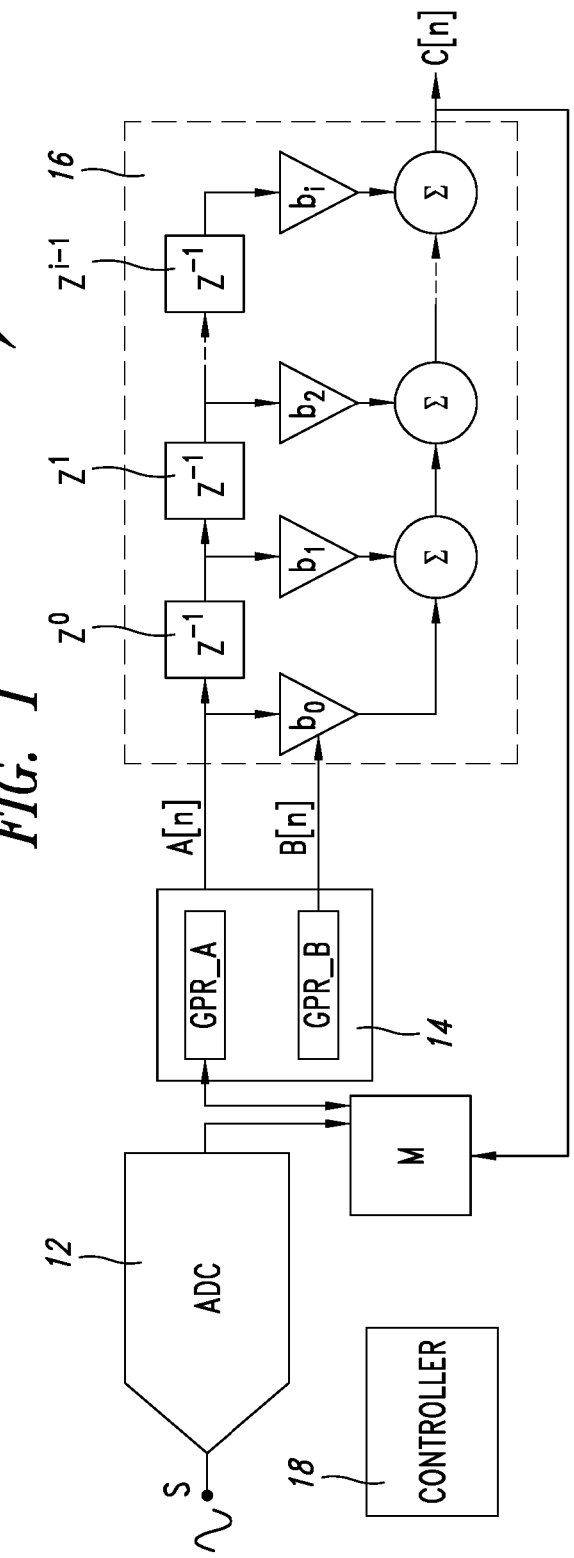
FIG. 2 is an exemplary diagram of a MAC circuit.

FIG. 2 is an exemplary diagram of a MAC circuit unit 10 which may be comprised in a DSP, comprising:
- an input node S, configured to receive an electric input signal;
- an analog-to-digital converter circuit 12, configured to receive said input signal S and to apply time-sampling thereto, providing a sampled electric signal A as a result;
- a memory circuit block M, configured to store data;
- a first memory register GPR_A of a set of registers 14, configured to be loaded with sampled data A[n] values from memory to use as a first operand;
- a second memory register GPR_B of the set of registers 14, configured to be loaded with values from memory to use as multiplication coefficients or second operand B[n];
- a controller 18; and
- a finite impulse response (briefly, FIR) circuit 16, for instance a 4-tap FIR stage as exemplified in FIG. 2 comprising delay elements $z_0, z_1, \ldots, z_{i-1}$, configured to multiply the input signal samples A[i] by a set B of coefficients $b_0, b_1, b_2, b_i$, providing as a result a signal C which may be expressed, for example, as:

$$C[k] = \Sigma_{i=0}^{3} A[i+k] * B[i]$$

wherein C[k] indicates the k-th value provided as output by the FIR filter 16.

The controller 18, may be coupled to the analog-to-digital converter circuit 12, the memory circuit block M, the first memory register GPR_A, the second memory register GPR_B, and the finite impulse response circuit 16, and configured to control the DSP operations.

For example, in the considered example, the FIR filter 16 may provide a first value C[0] which may be expressed as:

$$C[0] = \sum_{i=0}^{3} A[i] * B[i] = a[0] * b[0] + a[1] * b[1] + a[2] * b[2] + a[3] * b[3]$$

For example, in the considered example, the FIR filter 16 may provide a second value C[1] which may be expressed as:

$$C[1] = \sum_{i=0}^{3} A[i+1] * B[i] = a[1] * b[0] + a[2] * b[1] + a[3] * b[2] + a[4] * b[3]$$

For example, in the considered example, the FIR filter 16 may provide a seventh value C[7] which may be expressed as:

$$C[7] = \sum_{i=0}^{3} A[i+7] * B[i] = a[7] * b[0] + a[8] * b[1] + a[9] * b[2] + a[10] * b[3]$$

For instance, FIR filter parameters b0, b1, b2, b3 may be stored in the memory circuit block M and loaded to the register GPR_B therefrom before applying data processing and performing FIR filtering 16. This way, a FIR filter 16 may be used to perform a MAC operation.

In this scenario, how data is stored and loaded to the operand registers GPR_A, GPR_B impacts on the computational and power-consumption efficiency of the MAC circuit 10.

In a conventional first exemplary scenario, the memory circuit block M may have a width equal to the number of taps of the FIR stage 16, for instance being a matrix of registers having a width equal to four.

Still in the considered example, sampled data values a[0], ..., a[i], ... a[N−1] from the sampled data values A[n] may be stored sequentially row-wise in the matrix of registers of memory circuit block M.

For instance, Table I summarizes an exemplary of an arrangement of data into memory circuit block M.

TABLE I

Exemplary Arrangement of Data Into Memory M

| A[0] | A[1] | A[2] | A[3] |
|---|---|---|---|
| A[4] | A[5] | A[6] | A[7] |
| A[8] | A[9] | A[10] | A[11] |
| A[N − 4] | A[N − 3] | A[N − 2] | A[N − 1] |
| B[0] | B[1] | B[2] | B[3] |

For instance, in the considered exemplary scenario, in the further assumption that the initial memory address is known, computing a MAC operation using one FIR processing stage 16 may comprise:

a) pre-loading coefficients B[0], . . . , B[n] in the second register GPR_B;

b) loading four data values of the sampled signal A from memory into the first register GPR_A, for instance if address=0 such elements may be located at A[address], A[address+1], A[address+2], A[address+3];

c) performing a MAC computation 16, providing as output $C[k]=\Sigma_{i=0}^{3} A[i+k]*B[i]$;

d) store accumulation results C[k] into memory M; and e) iterate steps b) to d) until all values stored in memory are computed, for instance four times in the example considered, obtaining a final vector of MAC computation results C=(c[0], c[1], c[2], c[3]).

Such a solution presents a first drawback in that it does not envisage re-usage of sampled data A.

Specifically, to calculate c[0] and c[1] it may be advantageous to be able to simply exchange few operands of the sum, namely a[1] with a[0] and with a[3] in place of a[4], since in obtaining c[0] and c[1], the only different operands are a[0] and a[4]. Conversely, in existing solution the data elements a[1] to a[3] are always loaded.

A second drawback of the solution as discussed in the foregoing may be in that memory access is performed in a non-aligned way, in the sense that data from multiple rows of memory circuit block M are used to perform a single MAC computation. For instance, to calculate an i-th output value C[i], data elements a[i], a[i+1], a[i+2], and a[i+3] are loaded from memory circuit M. Yet, if index i is not multiple of four, for example 0, 4, 8, . . . , then data elements a[i] to a[i+3] are not stored in one same memory line. Such a mis-aligned memory accessing, together with the lack of data-reusage, makes the method of computing MAC operations discussed in the foregoing complex and time-consuming.

One or more embodiments may facilitate improving such a MAC computation and data-processing using a data management system and corresponding computational method as discussed in the foregoing.

One or more embodiments may comprise, as exemplified in Table II and as discussed in the following:

loading two sets of (taps-sized) sampled data A in adjacent memory (register) portions, in a contiguous way; and duplicate a copy of the data of B, and "right-shift" the replica position in (data processing) calculation hardware, for instance sliding the copy of a number of elements, e.g., equal to one or more in one, e.g., right, direction.

TABLE II

Exemplary Hardware Calculation, with Two Sets of Sampled Data A, Data B and a Right-Shifted Copy of B

| A[0] | A[1] | A[2] | A[3] | A[4] | A[5] | A[6] | A[7] |
|---|---|---|---|---|---|---|---|
| . . . | . . . | . . . | . . . | . . . | . . . | . . . | . . . |
| B[0] | B[1] | B[2] | B[3] | | | | |
| | B[0] | B[1] | B[2] | B[3] | | | |

Figure 3:
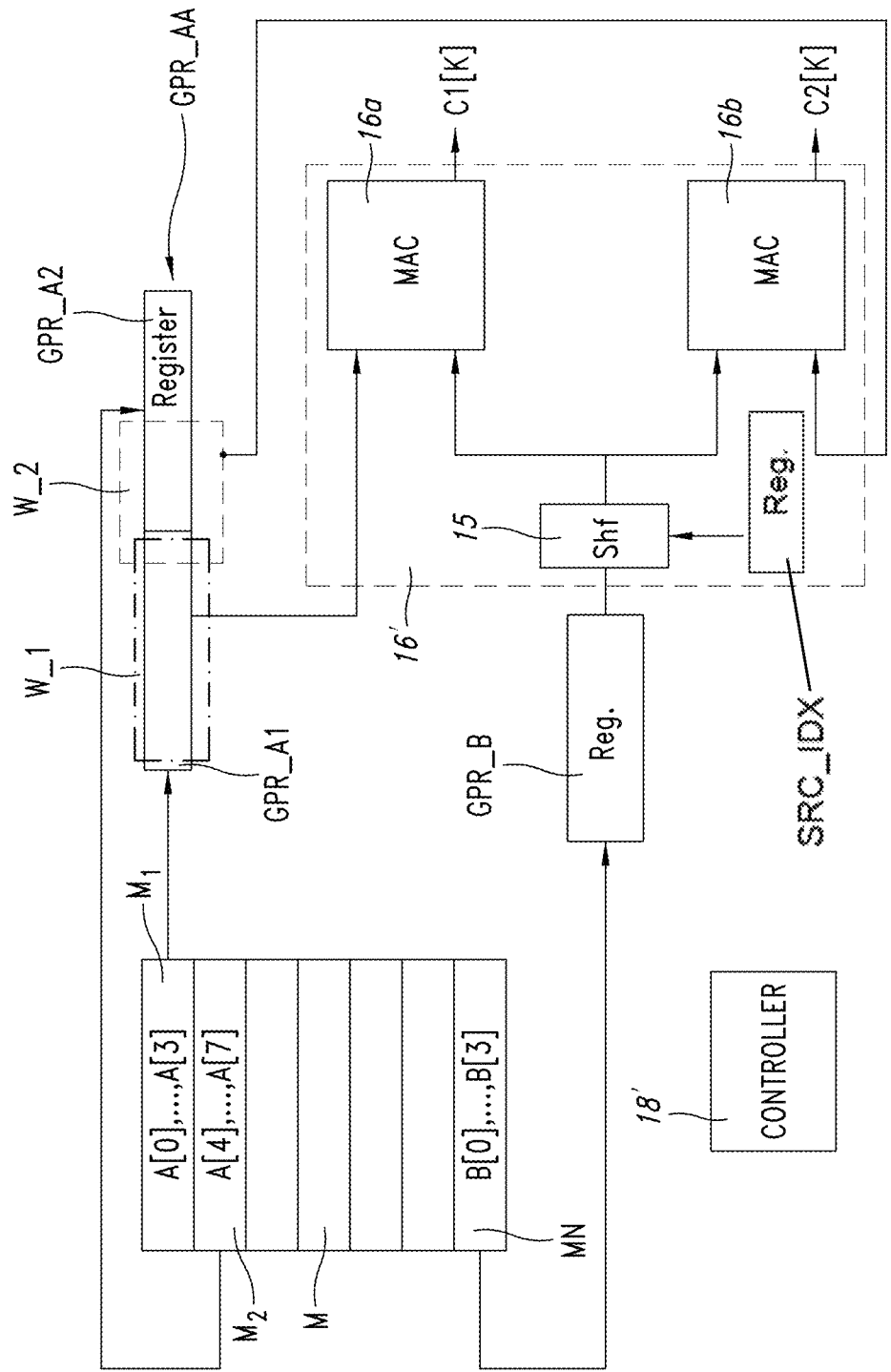
FIG. 3 is an exemplary diagram of a method as per the present disclosure.

In one or more embodiments as exemplified in FIG. 3, data may be loaded from memory circuit block M into a pair of registers GPR_AA, GPR_B which may be configured so that:

a first register GPR_AA is configured to host two lines or rows of memory data M1, M2 contiguously, the first line M1 in a first portion GPR_A1 and the second line M2 in a second portion GPR_A2;

a second register GPR_B is configured to store the coefficients B loaded from a respective memory location MN;

a third register SRC_IDX is configured to host even index numbers which are indicative of the degree of overlap of the data between subsequent MAC operations, for instance indicative of a distance between indices of elements of datasets comprised in different windows used as operand to perform data processing operations; and a shifter circuit 15, configured to receive data stored in the second register GPR_B and in the third register SRC_IDX and to generate shifted replicas of data in the second register.

One or more embodiments may comprise also a pipeline of parallel MAC operations, wherein:

a first MAC operation 16a is performed using i) as a first operand, data in a first window W_1, for instance overlapping onto the first portion GPR_A1 of the data stored first register GPR_AA, and ii) as a second operand, the data stored in the second register GPR_B, wherein the second operand of the first MAC operation has a first index equal to the value of the data stored in the third register SRC_IDX; and a second MAC operation 16b is performed using i) as a first operand, data in a second window W_2, for instance overlapping at least partially onto both the first portion GPR_A1 and the second portion GPR_A2 of the data stored in the first register GPR_AA, and ii) as a second operand, the data stored in the second register GPR_B, wherein the second operand of the first MAC operation has a first index equal to the value of a data stored in the third register SRC_IDX incremented of one; in other words, the second operand comprises data values like the data values stored in the second register GPR_B but arranged in a different order than the order in which they are stored (for instance, being right-shifted of a quantity proportional to the value of the index SRC_IDX).

One or more embodiments of the discussed dual MAC operation 16a, 16b may be expressed in pseudo-code with a single command line, for instance as:

stmac % Prd, % rs2, % rs1, % rs0, str_idx=#imm where:

% Prd is the paired destination register in memory M, which may be configured to store accumulation results C[k];

% rs1 and % rs2 are two source registers GPR_A1, GPR_A2 which contiguously store data of the input register GPR_AA;

% rs0 is a source register GPR_B; and str_idx is used to indicate which element of data A in the first portion register % rs1 is aligned to the first element in the source register GPR_B, wherein imm is a parameter proportional to a maximum number N of the elements in one register, for instance N=4 and imm= (N/2−1)=1 in the considered example.

For example, in the hypothesis that data is stored as discussed with respect to TABLE I in memory when the parameter imm has a first value, e.g., imm=0, then the index srx_idx has a first value, e.g., SRC_IDX=0, the result of the first MAC operation 16a may be expressed as:

$$\text{Prd\_low} = c[0] = \sum_{i=0}^{3} a[i+k] * b[i] =$$
$$a[k]*b[0] + a[k+1]*b[1] + a[k+2]*b[2] + a[k+3]*b[3]$$

while the result of the second MAC operation 16b may be expressed as:

$$\text{Prd\_high} = c[1] = \sum_{i=0}^{3} a[i+k+1] * b[i] =$$
$$a[k+1]*b[0] + a[k+2]*b[1] + a[k+3]*b[2] + a[k+4]*b[3]$$

where,
a[k]~a[k+3] are stored in the first portion GPR_A1, or register % rs1,
a[k+4]~a[k+7] are stored in the second portion GPR_A2 or register % rs2, and
prd_low is the lower part of a register % prd storing the MAC operations results, for instance a location in the memory M, and prd_high is the higher part of the same register % prd.

In another example, if the parameter imm has a second value, e.g., imm=1, then the index SRC_IDX may have a second value, e.g., SRC_IDX=2, and the result of the first and second MAC operations 16a, 16b may be expressed as:

$$k = imm * 2 = 2$$
$$C1[k] = \sum_{i=0}^{3} a[i+k]*b[i] = a[2]*b[0] + a[3]*b[1] + a[4]*b[2] + a[5]*b[3]$$
$$C2[k] =$$
$$\sum_{i=0}^{3} a[i+k+1]*b[i] = a[3]*b[0] + a[4]*b[1] + a[5]*b[2] + a[6]*b[3]$$

In one or more embodiments, using a method as exemplified herein to perform MAC operations 16a, 16b may present one or more of the following advantages:

facilitating aligned memory accesses, for instance reading data from a single memory line to perform a single MAC instruction; and facilitating data reusage, for instance in a "load once and use to the end" way.

As exemplified herein, a method may comprise:

providing a memory circuit (for instance, M) comprising a plurality of memory registers (for instance, M1, M2, MN) and configured to store datasets therein, the datasets having a dataset size and comprising a set of dataset elements, the dataset comprising a set of ordered indexed elements having respective ordered indices;

providing a first general purpose register (for instance, GPR_AA) configured to store datasets loaded from at least two memory registers (for instance, M1, M2) of said memory circuit, the first general purpose register comprising at least two register portions (for instance, GPR_A1, GPR_A2) configured to store a respective loaded dataset;

providing a second general purpose register (for instance, GPR_B) having said dataset size and configured to store a dataset of data-processing coefficients;

providing a shift-setting parameter (for instance, SRC_IDX) as a function of said dataset size;

accessing said memory circuit, retrieving therefrom a first dataset from a first memory register (for instance, M1) and at least a second dataset from at least a second memory register (for instance, MN) in said plurality of memory registers;

storing said retrieved first dataset, respectively at least one second dataset, in a first register portion (for instance, GPR_A1), respectively at least a second register portion (for instance, GPR_A2), of said at least two register portions of said first general purpose register; and applying data-processing (for instance, 16) to a first operand (for instance, GPR_x) and at least a second operand (for instance, GPR_y), wherein applying data processing comprises:
a) generating (for instance, 15) a replica of the dataset of coefficients (for instance, GPR_B);
b) applying a first data-processing (for instance, 16a) using, as said first operand, a first sub-set of dataset elements stored in said first general purpose register comprised in a first window (for instance, W_1) having a size equal to said dataset size, and using, as said second operand, said second general purpose register, obtaining a first result (for instance, C1[k]);
c) applying at least a second data-processing (for instance, 16b) using, as said first operand, a second sub-set of dataset elements stored in said first general purpose register comprised in a second window (for instance, W_2) having a size equal to said dataset size, and using, as said second operand, said replica of said dataset of coefficients, obtaining a second result (for instance, C2[k]),
wherein said second sub-set of dataset elements comprises at least one dataset element having an index different from indexes of elements comprised in said first sub-set of dataset elements, and
wherein said first sub-set, respectively second sub-set, comprised in said first window (for instance, W_1), respectively second window (for instance, W_2) comprises a first element selected as a function of said shift-setting parameter; and
d) providing said first (for instance, C1[k]), respectively second (for instance, C2[k]), result to a user circuit (for instance, M).

As exemplified herein, providing said shift-setting parameter (for instance, SRC_IDX) as a function of the size of said second general purpose register may comprise computing the setting parameter value (SRC_IDX) as an even multiple of a value of half the size of said second general purpose register decreased by one.

As exemplified herein:
said second sub-set of dataset elements may comprise at least one dataset element having an index greater than indices of elements comprised in said first sub-set of dataset elements; and/or
said first sub-set, respectively second sub-set, comprised in said first window (W_1), respectively second window (W_2), may comprise a first element selected as a function of said shift-setting parameter, the second window being spaced of one element with respect to the first window.

As exemplified herein:
said dataset of coefficient values may comprise MAC, multiply and accumulate, processing coefficients; and
applying said data-processing may comprise applying MAC processing to said datasets stored in said first general purpose register and to said dataset of MAC processing coefficients stored in said second general purpose register.

As exemplified herein, a multiply-and-accumulate, MAC, circuit (for instance, 10) may comprise:
a memory circuit (for instance, M) comprising a plurality of memory registers (for instance, M1, M2, MN) and configured to store datasets therein, the datasets each comprising a set of dataset elements and each having a dataset size;
a first general purpose register (for instance, GPR_AA) configured to store datasets loaded from at least two memory registers (for instance, M1, M2) of said memory circuit (M), the first general purpose register (for instance, GPR_AA) comprising at least two register portions (for instance, GPR_A1, GPR_A2) configured to store a respective loaded dataset;
a second general purpose register (for instance, GPR_B) having said dataset size and configured to store a dataset of coefficient values comprising data-processing coefficients, the dataset comprising a set of ordered indexed elements having respective ordered indices; and
a MAC processing circuit (for instance, 16') coupled to said first general purpose register and to said second general purpose register, the MAC processing circuit comprising:
a) a replicating processing circuit unit (for instance, 15) coupled to said second memory register and configured to receive a shift-setting parameter value (for instance, SRC_IDX) and to generate a replica of the dataset of coefficients; and
b) at least one MAC processing unit (16a, 16b) coupled to said replicating processing circuit unit (15) and to said first (GPR_AA) and second (GPR_B) general purpose registers, the at least one MAC processing unit (16a, 16b) configured to:
apply a first MAC processing (16a) using, as said first operand (GPR_x), a first sub-set of dataset elements stored in said first general purpose register (GPR_AA) comprised in a first window (W_1) having a size equal to said dataset size, and using, as said second operand (GPR_y), said second general purpose register (GPR_B), obtaining a first MAC product (C1[k]) as a result; and
apply at least a second MAC processing (16b) using, as said first operand, a second sub-set of dataset elements stored in said first general purpose register comprised in a second window (for instance, W_2) having a size equal to said dataset size, and using, as said second operand, said shifted-replica of said dataset of coefficients, obtaining a second MAC product (for instance, C2[k]) as a result,
wherein said second sub-set of dataset elements comprises at least one dataset element having an index different from indices of elements comprised in said first sub-set of dataset elements,
wherein said first sub-set, respectively second sub-set, comprised in said first window, respectively second window comprises a first element selected as a function of said shift-setting parameter.

As exemplified herein, said at least one MAC processing unit (for instance, 16a, 16b) may comprise at least one FIR filter circuit (for instance, 16), for example, a 3-tap FIR filter, having a dataset of FIR coefficients equal to said dataset of MAC coefficients.

As exemplified herein, said at least one MAC processing unit (for instance, 16a, 16b) may comprise a pair of FIR filters (for instance, 16a, 16b) comprising:
a first FIR filter (for instance, 16a) configured to apply the first MAC processing using, as a first operand, a first sub-set of dataset elements stored in said first general purpose register comprised in said first window having a size equal to said dataset size, and using, as a second operand, said second general purpose register, obtaining a first MAC product as the first result; and
at least a second FIR filter (for instance, 16b) configured to apply at least a second MAC processing (16b) using, as a first operand, a second sub-set of dataset elements stored in said first general purpose register comprised in said second window having a size equal to said dataset size, and using, as a second operand, said replica of said dataset of coefficients, obtaining a second MAC product as the second result,
wherein said second sub-set of dataset elements comprises at least one dataset element having an index different from indices of elements comprised in said first sub-set of dataset elements.

As exemplified herein, providing said shift-setting parameter (for instance, SRC_IDX) as a function of the size of said second general purpose register may comprise computing the setting parameter value as an even multiple of a value of half the size of said second general purpose register decreased by one.

As exemplified herein:
said second sub-set of dataset elements may comprise at least one dataset element having an index greater than indices of elements comprised in said first sub-set of dataset elements; and/or
said first sub-set, respectively second sub-set, comprised in said first window (W_1), respectively second window may comprise a first element selected as a function of said shift-setting parameter, the second window being spaced of one element with respect to the first window.

As exemplified herein, a DSP system may comprise:
an input node (for instance, S) configured to receive an electric signal;
an ADC converter (for instance, 12) coupled to said input node (S) and configured to apply time-sampling to the electric signal received therefrom;
a controller 18; and
the MAC circuit (for instance, 10) as exemplified herein, wherein said memory circuit (for instance, M) is coupled to the ADC converter and configured to store sets of time-samples of the electric signal received therefrom as datasets in said memory registers (for instance, M1, M2, MN) having dataset size. The controller 18 may be coupled to the ADC converter, the MAC circuit, the memory circuit, the memory registers, etc., and is configured to control the DSP operations.

As exemplified herein, a computer program product may comprise instructions which, when the program is executed by a computer, cause the computer to carry out the method as exemplified herein.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
retrieving a plurality of datasets from respective memory registers of a plurality of memory registers of a memory, wherein the datasets have a dataset size and comprise sets of ordered indexed elements having respective indices;
storing the retrieved plurality of datasets in respective register portions of a first register;
storing a dataset of coefficients having the dataset size in a second register;
setting a shift-setting parameter as a function of the dataset size;
storing the dataset of coefficients in a shifter;
applying a first operation using, as a first operand, a first sub-set of dataset elements stored in a first window of the first register, the first window having a size equal to the dataset size, and using, as a second operand, the dataset of coefficients stored in the shifter, generating a first interim result;
applying a second operation using, as a first operand, a second sub-set of dataset elements stored in a second window of the first register, the second window having a size equal to the dataset size, and using, as a second operand, a shifted replica of the dataset of coefficients, generating a second interim result; and
generating an output based on the first and the second interim results, wherein:
the second sub-set of dataset elements has at least one dataset element having an index different from indices of elements of the first sub-set of dataset elements;
the first sub-set of dataset elements has a first element selected as a function of the shift-setting parameter; and
the second sub-set of dataset elements has a first element selected as a function of the shift-setting parameter.

2. The method of claim 1, wherein the plurality of datasets comprises two datasets.

3. The method of claim 1, wherein setting the shift-setting parameter as a function of the dataset size comprises computing a shift-setting parameter value as an even multiple of a value, wherein the value is half the size of the second register decreased by one.

4. The method of claim 1, wherein the second sub-set of dataset elements has at least one dataset element having an index greater than indices of elements of the first sub-set of dataset elements.

5. The method of claim 1 wherein the second window is shifted by one element with respect to the first window.

6. The method of claim 1, wherein:
the dataset of coefficients comprises multiply and accumulate (MAC) processing coefficients; and
the first and second operations implement MAC operations.

7. The method of claim 1, wherein the first and second operations implement finite impulse response (FIR) filtering and the dataset of coefficients comprises FIR coefficients.

8. The method of claim 1, wherein the first and second operations are iterative, and the shift-setting parameter is iteratively set in each iteration.

9. The method of claim 1, comprising generating the shifted replica of the dataset of coefficients by shifting the coefficients of the set of coefficients stored in the shifter based on the shift-setting parameter.

10. A device, comprising:
a memory having a plurality of memory registers;
a first register;
a second register; and
data processing circuitry coupled to the memory, the first register and the second register, wherein the data processing circuitry, in operation:

retrieves a plurality of datasets from a respective memory registers of the memory, wherein the datasets have a dataset size and comprise sets of ordered indexed elements having respective indices;

stores the retrieved plurality of datasets in respective portions of the first register;

stores a dataset of coefficients, the dataset of coefficients having the dataset size;

sets a shift-setting parameter as a function of the dataset size;

applies a first operation using a first sub-set of dataset elements stored in a first window of the first register as a first operand and the dataset of coefficients as a second operand, generating a first interim result, the first window having a size equal to the dataset size;

generates a shifted replica of the dataset of coefficients based on the dataset of coefficients and the shift-setting parameter;

applies a second operation using a second sub-set of dataset elements stored in a second window of the first register as a first operand and the shifted replica of the dataset of coefficients as a second operand, generating a second interim result, the second window having a size equal to the dataset size; and generates an output based on the first and second interim results, wherein, the second sub-set of dataset elements comprises at least one dataset element having an index different from indices of elements of the first sub-set of dataset elements;

the first sub-set of dataset elements has a first element selected as a function of the shift-setting parameter; and the second sub-set of dataset elements has a first element selected as a function of the shift-setting parameter.

11. The device of claim 10, wherein the plurality of datasets comprises two datasets.

12. The device of claim 10, wherein the data processing circuitry, in operation, computes a shift-setting parameter value as an even multiple of a value, wherein the value is half the size of the second register decreased by one.

13. The device of claim 10, wherein the second sub-set of dataset elements has at least one dataset element having an index greater than indices of elements of the first sub-set of dataset elements.

14. The device of claim 10, wherein the second window is shifted by one element with respect to the first window.

15. The device of claim 10, wherein:
the dataset of coefficients comprises multiply and accumulate (MAC) processing coefficients; and
the data processing circuitry comprises:
a first MAC circuit, which, in operation, implements the first operation; and
a second MAC circuit, which, in operation, implements the second operation.

16. The device of claim 15, wherein the data processing circuitry, in operation, implements finite impulse response (FIR) filtering, and the MAC processing coefficients are FIR coefficients.

17. The device of claim 10, wherein the data processing circuitry, in operation, iteratively performs the first and second operations, and iteratively sets the shift-setting parameter in each iteration.

18. A system, comprising:
an analog-to-digital converter, which, in operation, time samples analog signals; and
digital signal processing circuitry coupled to the analog-to-digital converter and including a memory, a first register and a second register, wherein the digital signal processing circuitry, in operation:
stores datasets of time samples generated by the analog-to-digital converter in the memory, the datasets having a dataset size and comprising sets of ordered indexed elements having respective indices;
retrieves a plurality of datasets from the memory and stores the retrieved datasets in respective portions of the first register;
stores a dataset of coefficients in the second register, the dataset of coefficients having the dataset size;
stores the dataset of coefficients in a shifter;
sets a shift-setting parameter as a function of the dataset size;
generates a first interim result using a first sub-set of dataset elements stored in a first window of the first register as a first operand and the dataset of coefficients stored in the shifter as a second operand of a first processing operation, the first window having a size equal to the dataset size;
generates a shifted replica of the dataset of coefficients;
generates a second interim result using a second sub-set of dataset elements stored in a second window of the first register as a first operand and the shifted replica of the dataset of coefficients as a second operand of a second processing operation, the second window having a size equal to the dataset size; and
generates an output based on the first and second interim results, wherein,
the second sub-set of dataset elements comprises at least one dataset element having an index different from indices of elements of the first sub-set of dataset elements;
the first sub-set of dataset elements has a first element selected as a function of the shift-setting parameter; and
the second sub-set of dataset elements has a first element selected as a function of the shift-setting parameter.

19. The system of claim 18, wherein:
the dataset of coefficients comprises multiply and accumulate (MAC) processing coefficients; and
the digital signal processing circuitry comprises:
a first MAC circuit, which, in operation, implements the first operation; and
a second MAC circuit, which, in operation, implements the second operation.

20. The system of claim 19, wherein the digital signal processing circuitry, in operation, implements finite impulse response (FIR) filtering, and the MAC processing coefficients are FIR coefficients.

21. The system of claim 18, wherein the digital signal processing circuitry, in operation, iteratively performs the first and second operations, and iteratively sets the shift-setting parameter in each iteration.

22. The system of claim 18 wherein the memory comprises a plurality of memory registers each having a size equal to the dataset size.

23. A non-transitory computer-readable storage medium whose stored contents configure a computing system to perform a method, the method comprising:
retrieving a plurality of datasets from respective memory registers of a plurality of memory registers of the computing system, wherein the datasets have a dataset size and comprise sets of ordered indexed elements having respective indices;

storing the retrieved plurality of datasets in respective register portions of a first register;

storing a dataset of coefficients having the dataset size in a second register;

setting a shift-setting parameter as a function of the dataset size;

storing the dataset of coefficients in a shifter;

applying a first operation using, as a first operand, a first sub-set of dataset elements stored in a first window of the first register, the first window having a size equal to the dataset size, and using, as a second operand, the dataset of coefficients stored in the shifter, generating a first interim result;

applying a second operation using, as a first operand, a second sub-set of dataset elements stored in a second window of the first register, the second window having a size equal to the dataset size, and using, as a second operand, a shifted replica of the dataset of coefficients, generating a second interim result; and generating an output based on the first and the second interim results, wherein:

the second sub-set of dataset elements has at least one dataset element having an index different from indices of elements of the first sub-set of dataset elements;

the first sub-set of dataset elements has a first element selected as a function of the shift-setting parameter; and the second sub-set of dataset elements has a first element selected as a function of the shift-setting parameter.

24. The non-transitory computer-readable storage medium of claim 23, wherein setting the shift-setting parameter as a function of the dataset size comprises computing the shift-setting parameter value as an even multiple of a value, wherein the value is half the size of the second register decreased by one.

25. The non-transitory computer-readable storage medium of claim 23, wherein the first sub-set comprises an element selected as a function of the shift-setting parameter, and the second sub-set comprises an element selected as a function of the shift-setting parameter; and the second window is shifted by one element with respect to the first window.

26. The non-transitory computer-readable storage medium of claim 23, wherein the dataset of coefficients comprises multiply and accumulate (MAC) operation coefficients.

27. The non-transitory computer-readable medium of claim 23, wherein the contents comprise instructions, which when executed by the computing system, cause the computing system to perform the method.

* * * * *